United States Patent [19]
Ikuta et al.

[11] Patent Number: 5,933,238
[45] Date of Patent: Aug. 3, 1999

[54] OPTICAL CURRENT MEASUREMENT DEVICE AND METHOD OF MANUFACTURING IT

[75] Inventors: Sakae Ikuta, Tokyo; Masao Takahashi; Kiyohisa Terai, both of Kanagawa-ken, all of Japan

[73] Assignee: Kabushiki Kaisha Toshiba, Kawasaki, Japan

[21] Appl. No.: 08/906,335

[22] Filed: Aug. 5, 1997

[30] Foreign Application Priority Data

Aug. 5, 1996 [JP] Japan .................................. 8-205731

[51] Int. Cl.[6] .......................... G01R 33/032; G01R 31/00
[52] U.S. Cl. .......................... 356/364; 324/244.1; 324/96
[58] Field of Search .................................. 356/365, 366, 356/367, 368, 364, 351, 345; 250/225; 324/96, 244.1; 385/12; 359/280, 281

[56] References Cited

U.S. PATENT DOCUMENTS

| | | | |
|---|---|---|---|
| 4,564,754 | 1/1986 | Sato et al. ............................... | 250/225 |
| 4,797,607 | 1/1989 | Dupraz ...................................... | 324/96 |
| 5,475,489 | 12/1995 | Gottsche .................................. | 356/364 |
| 5,751,877 | 5/1998 | Ishizaka et al. ........................... | 385/93 |
| 5,764,046 | 6/1998 | Bosselmann .............................. | 324/96 |

*Primary Examiner*—Hoa Q. Pham
*Attorney, Agent, or Firm*—Finnegan, Henderson, Farabow, Garrett & Dunner, L.L.P.

[57] ABSTRACT

An optical measurement device that can be made of small size and weight without impairing accuracy under ambient temperature variations. An optical system accommodating box, includes a polarizing unit in which incoming light from a light source is converted to linearly polarized light, and an analyzing unit that resolves into orthogonal components linearly polarized light that has been rotated. A casing is constituted by three identical members 41, 42, and 43, the members being mutually stuck together with polarizer 34, analyzers 35 and reflective mirrors 36, in the form of thin sheets, interposed therebetween.

11 Claims, 5 Drawing Sheets

OPTICAL CURRENT MEASUREMENT DEVICE AND METHOD OF MANUFACTURING IT

BACKGROUND OF THE INVENTION

1. Field of the Invention

The present invention relates to an optical measurement device wherein an electric current is measured by applying the principle of the Faraday Effect, and in particular it relates to the construction of the optical system mounting box.

2. Discussion of the Related Art

An optical current transformer for GIS used in a power GIS system is described with reference to FIG. 1 as one example of a prior art optical measurement device.

A conductor 8 is arranged in a GIS tank 10 which contains, scaled within it, insulating gas at a pressure of a few atmospheres. This is covered by a sensor 2 consisting of quartz or lead glass etc. processed and assembled in such a way as to surround it. Light emitted from a light source is directed, through an optical communication fibre 71, into an optical system mounting box 31, where it is converted into prescribed linearly polarized light and reaches sensor 2 after passing through pressure-scaling window 11 which is arranged so as to maintain the gas pressure in GIS tank 10. Linearly polarized light passing through the vicinity of conductor 8 by repeated reflection in sensor 2 is again directed into optical system mounting box 31 by passing through pressure-sealing window 11. By the principle of the Faraday Effect, the plane of polarization is rotated in response to the current flowing in conductor 8 in proportion to the intensity of the magnetic field generated in its periphery, with the result that the linearly polarized light that re-enters optical mounting box 31 is rotated in accordance with the amount of the current of conductor 8. This is then subjected to vector resolution into mutually orthogonal X and Y components in optical mounting box 31 and exits by respective X-component receiving fibre 72 and Y-component receiving fibre 73. After this, it reaches a photodetector, not shown, where it is converted into an electrical signal, and the current value is then calculated by a current processing circuit.

Describing the construction of optical system mounting box 31 in more detail, incident light received by fibre 71 is converted into a parallel spatial beam by a lens 33, converted to linearly polarized light by a polarizer 34 comprising a calcite Glan-Thompson prism or the like, and output at the pressure sealing window 11. In contrast, the linearly polarized light that re-enters optical system mounting box 31 after rotation enters an analyzer 35 comprising a calcite Wollaston prism and/or polarizing beam splitter or the like and is separated into mutually orthogonal directions. This X component beam and Y component beam are collected by respective lenses 33 and are then output onto the X component receiving fibre 72 and Y component receiving fibre 73. Optical component mounting elements 32 are used to fix these optical components in position with their axes aligned.

However, such a construction is subject to the following problems.

The distance through which the optical flux is propagated in the gas is too long to maintain high accuracy. For example, if the optical flux is input to the optical fibre from a given optical component, if the distance between these two is 5 mm, and if the core of the optical fibre is a few microns in diameter, an accuracy of about 10,000 times is required. Furthermore, since the refractive index of the gas fluctuates due to changes in ambient temperature, the direction of the beam fluctuates, resulting in fluctuations in the amount of light passing between the optical components.

To maintain high accuracy with such a construction, the construction between the various structural components in optical system mounting box 31 is too complicated. More specifically, thermal strain produced by changes in ambient temperature results in displacement of the optic axes of the components with respect to each other and the construction is unstable in regard to vibration and shock.

Because of the above problems, the overall size of the optical current transformer becomes large. This militates against the demand for miniaturization of the GIS as a whole.

This invention is made in order to solve the aforementioned problems. Its object is to obtain an optical measurement device that can be made of small size and light weight without impairing its accuracy under ambient temperature variations.

SUMMARY OF THE INVENTION

According to the present invention, in order to solve these problems, the invention is directed to a current measurement device for measuring a current in a conductor by directing a linearly polarized beam of light around the conductor and then measuring the change in polarization angle, the device comprising:

a light source for emitting light:

a polarizing plate for receiving the emitted light and for outputting linearly polarized light toward the conductor;

a first analyzing plate for receiving light from around the conductor; and a second analyzing plate for receiving light from around the conductor;

wherein the polarizing plate, the first analyzing plate, and the second analyzing plate are arranged along a line.

In another aspect of the invention the polarizing plate, the first analyzing plate, and the second analyzing plate are held in position by an adhesive.

In yet another aspect, the current measurement device 1 comprises a first mirror for directing light into the first analyzing plate and a second mirror for directing fight into the second analyzing plate.

In yet another aspect, the first mirror and the second mirror are arranged in a line, and the first mirror and the second mirror are held in position by an adhesive.

In still another aspect, the polarizing plate is arranged to receive incoming light from the light source and the side facing the conductor is constituted as a half mirror, the first analyzing plate has polarization orientation at 45° from the polarizing plate and the side facing the conductor is constituted as a half mirror, the second analyzing plate has a polarization orientation set at 45° from said polarizer and 90° from said first analyzing plate, and the first analyzing plate and the second analyzing plate are linked by an optical path through a reflecting mirror.

In another aspect of the invention, the current measurement device includes a distributed refractive index rod-shaped lens between the light source and the polarizing plate.

In yet another aspect, the current measurement device includes a convex lens whose strain has been removed between the polarizing plate and the conductor and being held in position by a rubber adhesive.

In still another aspect of the invention, the polarizing plate, the first analyzing plate, and the second analyzing plate comprise wire-grid type polarizing elements made by arranging metallic particles in a multiplicity of parallel lines in glass.

In yet another aspect of the invention, the current measurement device including a glass medium having a half mirror surface facing the polarizing plate, a half mirror surface facing the first analyzing plate, and a transmitting surface facing the second analyzing, in another aspect of the invention, the glass medium has a transmitting surface opposite the polarizing plate, a reflecting surface opposite the first analyzing plate, and a reflecting surface opposite the second analyzing plate.

In another aspect of the embodiment containing a glass medium, the polarizing plate is arranged to receive incoming light form the light source and the side facing the conductor is constituted as a half mirror, wherein the first analyzing plate has polarization orientation at 45° from the polarizing plate and the side facing the conductor is constituted as a half mirror, and wherein the second analyzing plate has a polarization orientation set at 45° from said polarizer and 90° from said first analyzing plate.

In yet another aspect of the embodiment containing a glass medium, the current measurement device comprises a distributed refractive index rod-shaped lens between the light source and the polarizing plate, and a convex lens whose strain has been removed between the polarizing plate and the conductor and being held in position by a rubber adhesive.

In yet another aspect of the invention including a glass medium, the polarizing plate, the first analyzing plate, and the second analyzing plate comprise wire-grid type polarizing elements made by arranging metallic particles in a multiplicity of parallel lines in glass.

In another aspect of the invention, there is provided a method of manufacturing a current measurement device for measuring a current in a conductor by directing a linearly polarized beam of light around the conductor and then measuring the change in polarization angle, the method comprising the steps of:

aligning a first optical fiber unit and an optical component unit, the first optical fiber unit being for transmitting light to the optical component unit;

welding the first optical fiber unit to the optical component unit;

aligning a second optical fiber unit and the optical component unit, the second optical fiber unit being for receiving light from the optical component unit;

welding the second optical fiber unit to the optical component unit;

aligning a third optical fiber unit and the optical component unit, the third optical fiber unit being for receiving light for the optical component unit; and welding the third optical fiber unit to the optical component unit.

DETAILED DESCRIPTION OF THE PREFERRED EMBODIMENTS

Figure 1:
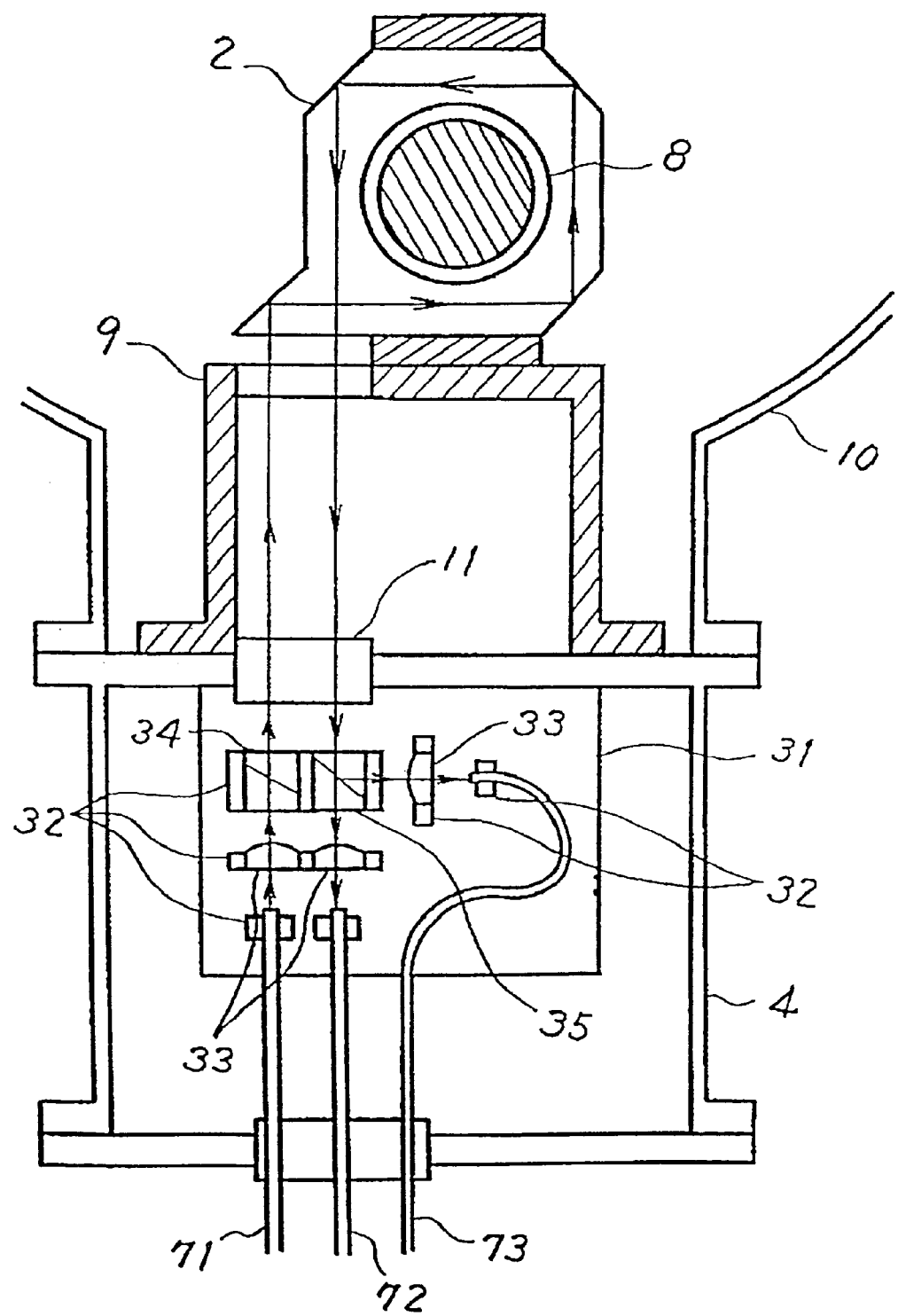
FIG. 1 shows a diagrammatic cross-sectional constructional view of a GIS optical current transformer in the prior art.
Figure 2:
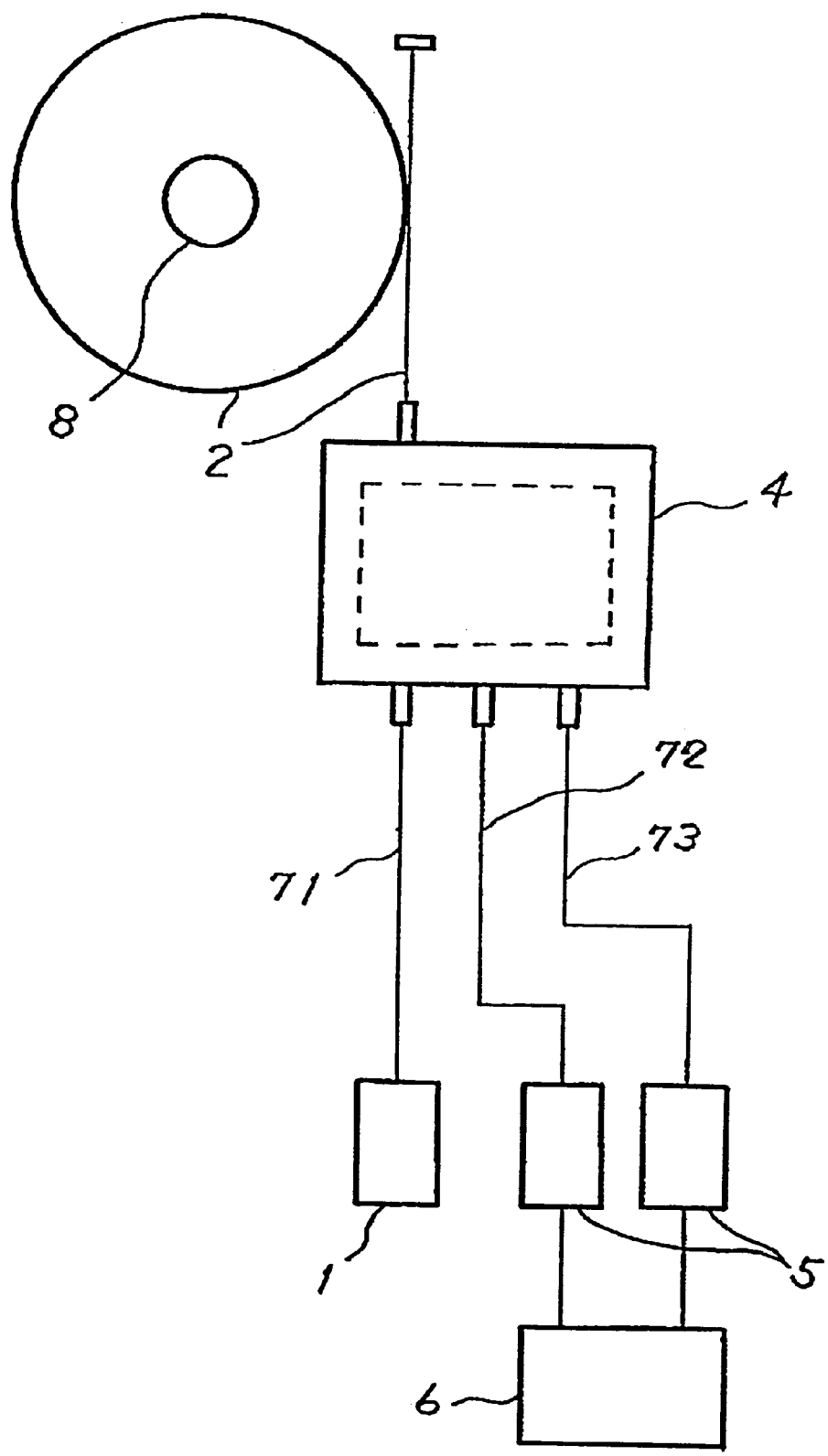
FIG. 2 shows a schematic diagram of the overall construction when the present invention is applied to an optical fibre type sensor.

Embodiments of the invention are described below with reference to the drawings. FIG. 2 is an overall constructional diagram showing the present invention embodied in an optical current transformer, and showing in particular the case where a fibre type sensor is employed.

Light emitted by a light source 1 is directed into an optical system accommodating box 4. This light is there converted to light of prescribed linear polarization; within sensor 2, its plane of polarization is then rotated, after which the light is again directed into optical system accommodating box 4. This time, it is resolved into mutually orthogonal X and Y components, which are then detected by an X-component receiving fibre 72 and Y-component receiving fibre 73, and the optical data is finally processed by a signal processing circuit 6.

The construction up to this point is the same as the related art, but in the present invention the construction within optical system accommodating box 4 is improved. The cross-sectional structure of optical system accommodating box 4 will now be described with reference to FIG. 3.

Optical system accommodating box 4 comprises three mounting members 41, 42, and 43, which are formed from identical members of small thermal expansion coefficient, and has optical component mounting units 321, 322, to be described in detail later, fixed at each end. 33 is a lens for directing linearly polarized light from optical system accommodating box 4 to a sensor associated with a conductor 8. After annealing etc. to remove optical strain, it is held in position by rubber adhesive. 34 is a polarizer formed in the shape of a thin sheet, which is used for converting light input from the light source into linearly polarized light. 35 are analyzers in the form of a thin sheet for extracting only the X component or only the Y component of linearly polarized light that has passed through the sensor of the conductor 8. Two analyzers 35 are arranged such that the polarization orientations which they detect are respectively orthogonal. In order to achieve a balanced initial condition in regard to the original linear polarization, the orientation of polarizer 34 is arranged at 45° with respect to the two analyzers 35. Polarizer 34 and analyzers 35 are wire-grid type polarizing elements, constituted by arranging a large number of fine metal particles in parallel straight lines in glass. Also, the surface of polarizer 34 facing conductor 8 is constituted as a half-mirror at which the intensities of the reflected light and transmitted light are respectively practically in the ratio 1:1. The surface of analyzer 35 (which is arranged facing X-component receiving fibre 72) facing conductor 8 is likewise constituted as a half-mirror. 36 are reflecting mirrors provided to deflect the optical path such that light-emitting fibre 71, X-component receiving fibre 72 and Y-component receiving fibre 73 are mutually parallel. 37 are distributed refractive index rod lenses for optically coupling light emitting fibre 71 and receiving fibres 72 and 73.

With such a construction, optical system accommodating box 4 is constituted of three mounting members 41, 42, and 43, but since these are all identical members and have the same thermal expansion coefficient displacement of the optic axes due to changes in temperature can be reduced. Also, since wire grid type polarizing elements are employed for polarizer 34 and analyzers 35, in contrast to polymer polarizing elements which are used in the polarizing filters of cameras etc., in addition to satisfying the minimum limiting accuracy that is needed for an optical current transformer, accuracy drifting due to thermal expansion can be prevented. Furthermore, the convex lenses 33, from which strain has been removed, are held in position with rubber adhesive. Thus, stress applied from their peripheries is absorbed by the rubber adhesive without causing changes in the polarization condition of the light passing through. Also, thanks to the adoption of a construction in which the optic path is reflected using reflecting mirrors 36 etc., the extent of the optic path within optical system accommodating box 4 can be shortened, making it possible to reduce the overall size; furthermore, as described above, the overall size of the device can be reduced by making the light-emitting fibre 71, X-component receiving fibre 72, and Y-component receiving fibre 73 mutually parallel. Furthermore, due to the provision of the three mounting members 41, 42, and 43, it becomes possible to mount polarizer 34, analyzers 35, and reflecting mirrors 36 without a complex operation for optic axis adjustment. Incidentally it should be noted that although a distributed refractive index rod lens 37 is employed as shown with the object of facilitating mounting onto optical component mounting unit 321 and reducing the overall size of the device, at the location where the light is directed into the vicinity of conductor 8, since particular precision is required where the light passes through sensor 2 in the vicinity of conductor 8 after passing through polarizer 34, an ordinary convex lens 33 is employed as shown.

Figure 4:
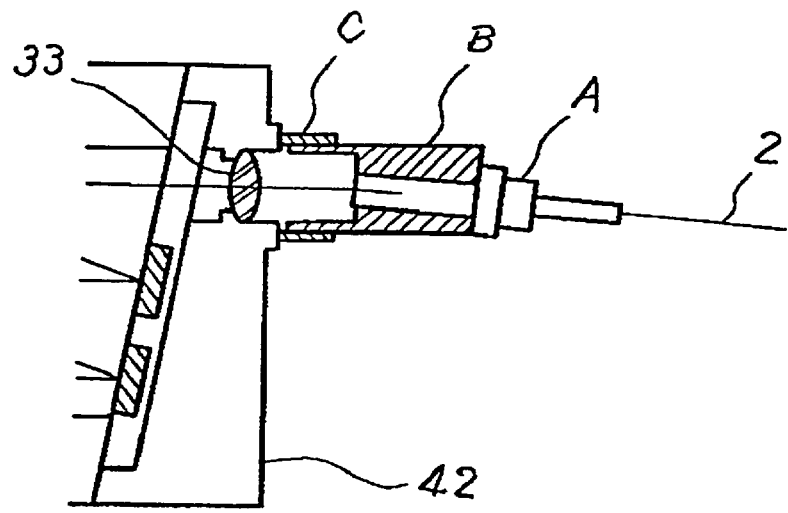
FIG. 4 shows a schematic diagram of details of an optical component mounting unit, of the optical system accommodating box shown in FIG. 3, mounted on the side facing the conductor.

Next, the construction of the optical component mounting unit, in particular the optical component mounting unit 322 facing conductor 8, which is used to align the optic axes when light enters or leaves optical system accommodating box 4, will be described in detail with reference to FIG. 4. Ferrule holder B is telescopically mounted onto ferrule A, and sleeve C is also fitted telescopically onto this. The tip of ferrule A is inclined as shown in the drawing to prevent reflected light from getting into the optical system accommodating box 4. Adjustment in the direction of the optic axis is performed by sliding ferrule holder B and sleeve C, and adjustment in the direction orthogonal to the optic axis is performed by sliding mounting member 42 and sleeve C so as to make the optic axes of optical system accommodating box 4 and sensor 2 coincide. After this, ferrule A, ferrule holder B, sleeve C and mounting member 42 are fixed by welding.

If fixing were performed using screws, since members of different types would be involved, strain would be generated on thermal expansion and misalignment would occur making it difficult to maintain high precision. Also if adhesive is used members of different types are involved making it difficult to maintain high precision on thermal expansion. In contrast, weld fixing involves members of the same type so there is no need to allow for the effects of loss of precision due to temperature changes.

Figure 5:
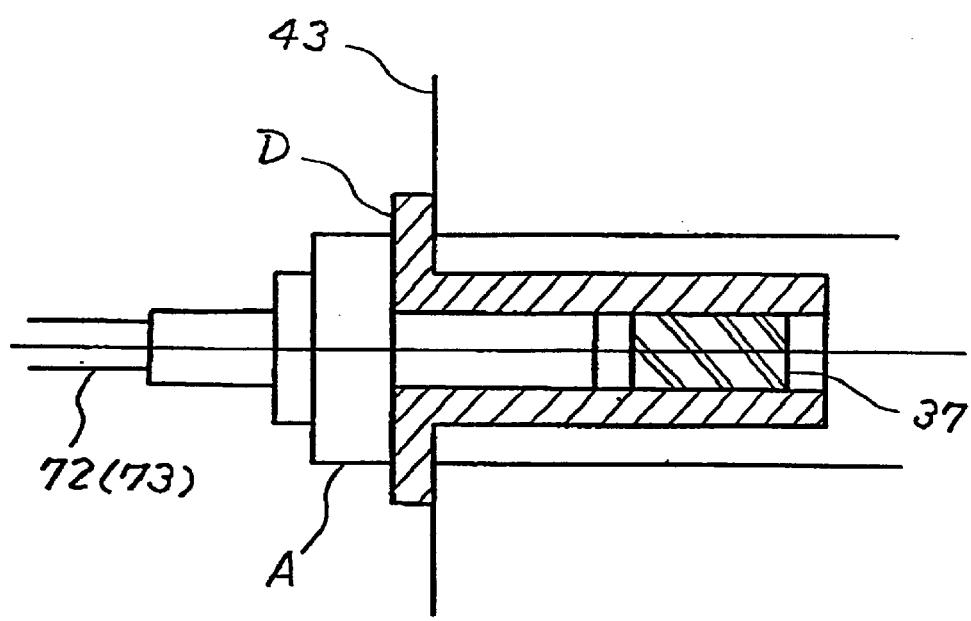
FIG. 5 shows a schematic diagram of details of an optical component mounting unit, of the optical system accommodating box shown in FIG. 3, mounted on the side facing the light source.

Next, optical component mounting unit 321 on the side facing the light source i.e. the mounting parts of X-component receiving fibre 72 and Y-component receiving fibre 73 will be described with reference to FIG. 5. Rod holder D is fixed by welding inserted in a hole formed in mounting member 43, assembled in a condition with the optic axes of ferrule A and distributed refractive index rod lens 37 coincident. More specifically, since the diameter of the hole formed in mounting member 43 is larger than the diameter of rod holder D, alignment of the optic axes in the orthogonal direction can be achieved by sliding rod holder D in the orthogonal direction with respect to the optic axes. The reason for weld-fixing is likewise because of considerations regarding the effect of thermal strain in lowering precision. Apart from this, as benefits of making the optical component mounting units 321, 322 common are performing optic axis alignment by sliding, the number of components is reduced and construction can be simplified, making it possible to reduce the size of the optical measurement device as a whole.

Figure 3:
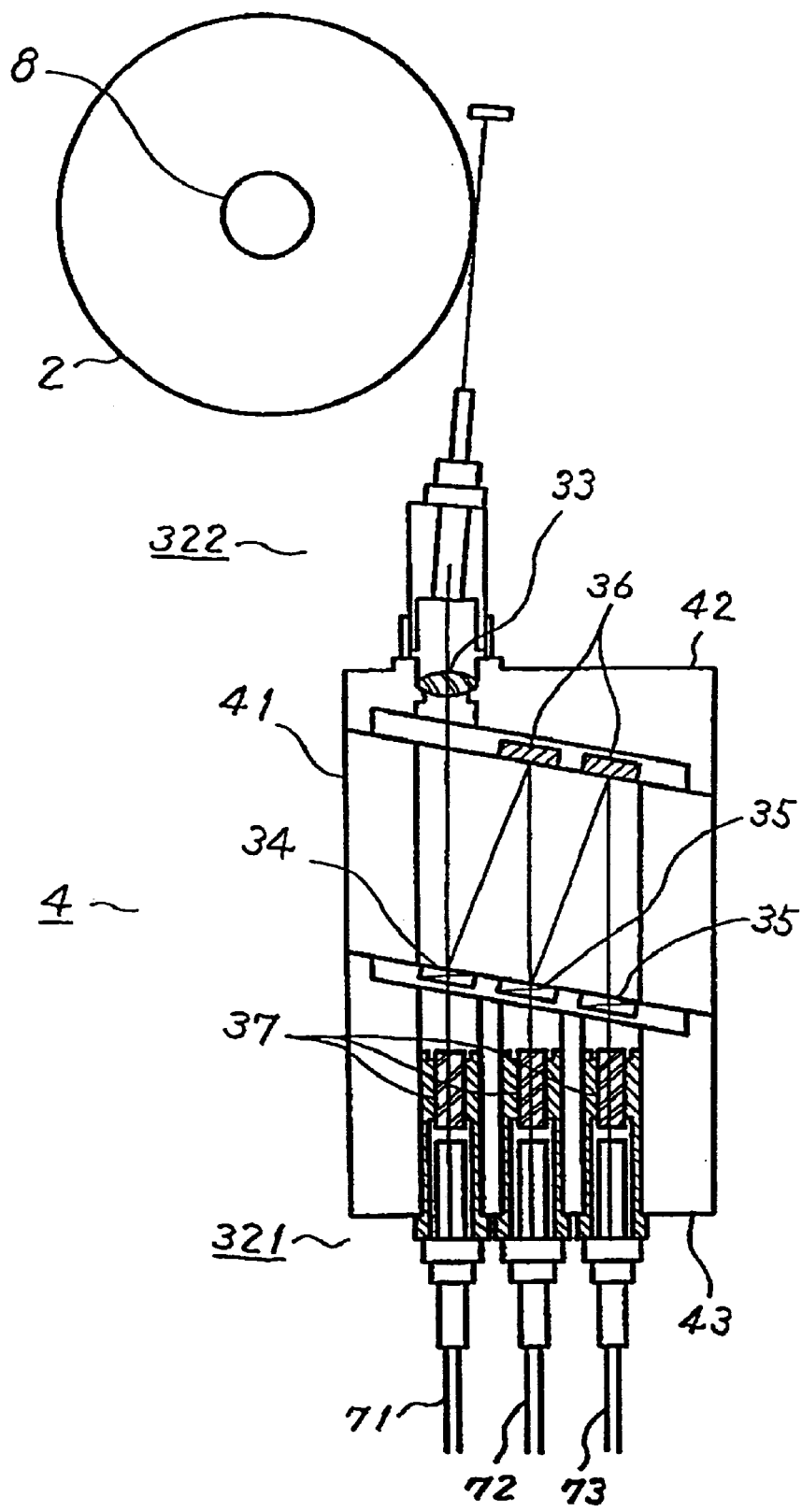
FIG. 3 shows a schematic diagram of a detailed cross-section of an optical system accommodating box according to an embodiment of the present invention.
Figure 6:
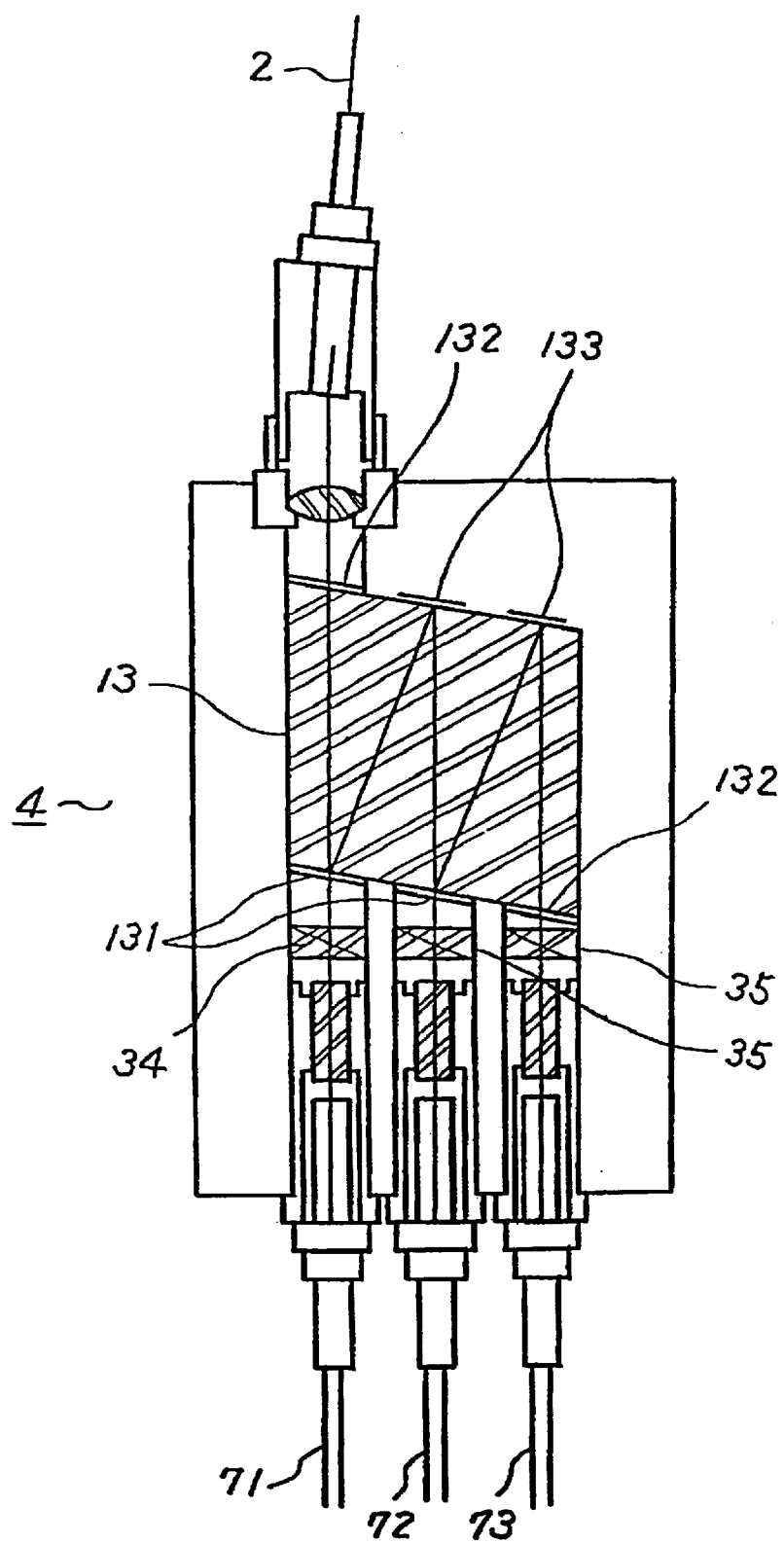
FIG. 6 shows a schematic diagram of a detailed cross-section of an optical system accommodating box according to another embodiment of the present invention.

A further embodiment of the present invention will now be described with reference to FIG. 6. Parts which are the same as in FIG. 3 are given the same reference symbols and further description is omitted.

A glass formed medium 13 is formed in a diamond shape with its two opposite faces parallel to each other. Of the faces on glass-form medium 13, on the face communicating with light-emitting fibre 71 and the face communicating with X-component receiving fibre 72, there is formed a partially reflecting surface 131 that gives a ratio of the reflected light intensity to the transmitted light intensity of 1:1; on the face communicating with sensor 2 and the face communicating with Y-component receiving fibre 73, there is formed a reflection-preventing surface 132; while the other reflecting faces of the optic path are formed with totally reflecting surfaces 133, respectively. Further characteristics are that the inside surfaces of optical component accommodating box 4 is surface-treated to prevent reflective scattering using for example matt block coating and that the box is hermetically sealed by making all joints of a gas and water-tight construction.

With such a construction, there is no need to provide two separate reflecting mirrors 36 as shown in the first embodiment, and, since a glass-form medium 13 formed with reflective surfaces is employed, the number of components and locations that must be stuck together can be reduced, making it possible to reduce the size of the optical current transformer and increase its precision. Also, by applying scattered reflection preventive surface treatment such as matt black coating to the inside surfaces of optical system accommodating box 4, lowering of measurement accuracy by stray light can be prevented. Also, since in this embodiment there is no need to individually interpose reflecting mirrors formed in the shape of thin sheets, optical system accommodating box 4 can be constituted of a single mounting member 44.

As described above, with this invention, an optical measurement device that can be made of small size and weight without impairing accuracy under ambient temperature variations and a method of manufacturing it can be obtained. Those skilled in the art will appreciate that modifications may be made to the structure of the invention without departing from its scope or spirit. In view of the foregoing, it is intended that the present invention cover modifications and variations of the invention provided they fall within the scope of the following claims and their equivalents.

What is claimed is:

1. A current measuring device for measuring a current in a conductor by directing a linearly polarized beam of light around the conductor and then measuring the change in polarization angle, the device comprising:

a light source for emitting light;

a polarizing plate for receiving the emitted light and for outputting linearly polarized light toward the conductor, wherein the polarizing plate is arranged to receive incoming light from the light source and the side facing the conductor is constituted as a half mirror;

a first analyzing plate for receiving light from around the conductor, wherein the first analyzing plate has a polarization orientation of 45° from the polarizing plate and the side facing the conductor is a half mirror;

a second analyzing plate for receiving light from around the conductor, wherein the second analyzing plate has a polarization orientation set at 45° from the polarizing plate and 90° from the first analyzing plate;

wherein the polarizing plate, the first analyzing plate, and the second analyzing plate are arranged along a line and are held in position by an adhesive; and wherein the first analyzing plate and the second analyzing plate are linked by an optical path through a reflecting mirror.

2. The current measurement device according to claim 1, further comprising a first mirror for directing light into the first analyzing plate and a second mirror for directing light into the second analyzing plate.

3. The current measurement device according to claim 2, wherein the first mirror and the second mirror are arranged in a line, and wherein the first mirror and the second mirror are held in position by an adhesive.

4. The current measurement device according to claim 1, further comprising a distributed refractive index rod-shaped lens between the light source and the polarizing plate.

5. The current measurement device according to claim 1, further comprising a convex lens whose strain has been removed between the polarizing plate and the conductor and being held in position by a rubber adhesive.

6. The current measurement device according to claim 1, wherein the polarizing plate, the first analyzing plate, and the second analyzing plate comprise wire-grid type polarizing elements made by arranging metallic particles in a multiplicity of parallel lines in glass.

7. A current measuring device for measuring a current in a conductor by directing a linearly polarized beam of light around the conductor and then measuring the change in polarization angle, the device comprising:

a light source for emitting light;

a polarizing plate for receiving the emitted light and for outputting linearly polarized light toward the conductor;

a first analyzing plate for receiving light from around the conductor;

a second analyzing plate for receiving light from around the conductor; and a glass medium having a half mirror surface facing the polarizing plate, a half mirror surface facing the first analyzing plate, a first transmitting surface facing the second analyzing plate, a second transmitting surface opposite the polarizing plate, a first reflecting surface opposite the first analyzing plate, and a second reflecting surface opposite the second analyzing plate;

wherein the polarizing plate, the first analyzing plate, and the second analyzing plate are arranged along a line.

8. The current measurement device according to claim 7, further comprising a distributed refractive index rod-shaped lens between the light source and the polarizing plate.

9. The current measurement device according to claim 7, further comprising a convex lens whose strain has been removed between the polarizing plate and the conductor and being fixed by a rubber adhesive.

10. The current measurement device according to claim 7, wherein the polarizing plate, the first analyzing plate, and the second analyzing plate comprise wire-grid type polarizing elements made by arranging metallic particles in a multiplicity of parallel lines in glass.

11. A current measuring device for measuring a current in a conductor by directing a linearly polarized beam of light around the conductor and then measuring the change in polarization angle, the device comprising:

a light source for emitting light;

a polarizing plate for receiving the emitted light and for outputting linearly polarized light toward the conductor, wherein the polarizing plate is arranged to receive incoming light from the light source and the side facing the conductor is constituted as a half mirror;

a first analyzing plate for receiving light from around the conductor, wherein the first analyzing plate has polarization orientation at 45° from the polarizing plate and the side facing the conductor is constituted as a half mirror;

a second analyzing plate for receiving light from around the conductor, wherein the second analyzing plate as a polarization orientation set at 45° from the polarizing plate and 90° from said first analyzing plate; and a glass medium having a half mirror surface facing the polarizing plate, a half mirror surface facing the first analyzing plate, and a transmitting surface facing the second analyzing plate;

wherein the polarizing plate, the first analyzing plate, and the second analyzing plate are arranged along a line.

* * * * *